(12) United States Patent
Cascino et al.

(10) Patent No.: US 10,852,263 B2
(45) Date of Patent: Dec. 1, 2020

(54) MICRO-HEATER ELEMENT FOR A MICROELECTROMECHANICAL SENSOR DEVICE AND CORRESPONDING MICROELECTROMECHANICAL SENSOR DEVICE

(71) Applicant: STMICROELECTRONICS S.R.L., Agrate Brianza (IT)

(72) Inventors: Salvatore Cascino, Gravina di Catania (IT); Antonello Santangelo, Belpasso (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 221 days.

(21) Appl. No.: 16/167,165

(22) Filed: Oct. 22, 2018

(65) Prior Publication Data

US 2019/0137427 A1 May 9, 2019

(30) Foreign Application Priority Data

Nov. 8, 2017 (IT) .......................... 102017000127348

(51) Int. Cl.
| | | |
|---|---|---|
| *G01N 27/12* | (2006.01) | |
| *H05B 3/02* | (2006.01) | |
| *H05B 3/20* | (2006.01) | |
| *H05B 3/10* | (2006.01) | |
| *B81C 1/00* | (2006.01) | |

(52) U.S. Cl.
CPC .............. *G01N 27/128* (2013.01); *B81C 1/00* (2013.01); *H05B 3/02* (2013.01); *H05B 3/10* (2013.01);
(Continued)

(58) Field of Classification Search
CPC ...... G01N 27/128; G01N 27/123; B81C 1/00; H05B 3/02; H05B 3/10; H05B 3/20; H05B 2203/002; H05B 2203/013
See application file for complete search history.

(56) References Cited

U.S. PATENT DOCUMENTS 6,091,050 A * 7/2000 Carr .................... H05B 1/0216
219/201
2010/0170888 A1 7/2010 Lee et al.
(Continued)

FOREIGN PATENT DOCUMENTS

KR 20110056008 A 5/2011

OTHER PUBLICATIONS

Dennis et al., "Design, Simulation and Modeling of a Micromachined High Temperature Microhotplate for Application in Trace Gas Detection", International Journal of Engineering & Technology 10(2): 67-74, Apr. 2010 (8 pages).
(Continued)

*Primary Examiner* — Ryan D Walsh
(74) *Attorney, Agent, or Firm* — Seed Intellectual Property Law Group LLP (57) ABSTRACT

A micro-heater element for a MEMS sensor device, envisages, in a single conductive layer: an outer ring, defining inside it a window; a heat-diffusion structure, arranged within the window, separated from the outer ring by a first separation gap; and connection elements, arranged between the heat-diffusion structure and the outer ring, and designed to connect the heat-diffusion structure to the outer ring. The outer ring is designed to dissipate energy upon passage of an electric current, and the heat-diffusion structure is designed to distribute, within the micro-heater element, the heat that is transferred by the outer ring through the connection elements.

24 Claims, 8 Drawing Sheets

(52) U.S. Cl.
CPC ............ *H05B 3/20* (2013.01); *G01N 27/123* (2013.01); *H05B 2203/002* (2013.01); *H05B 2203/013* (2013.01)

(56) References Cited

U.S. PATENT DOCUMENTS

| | | | |
|---|---|---|---|
| 2015/0277105 A1* | 10/2015 | Park | G02B 26/085 359/212.2 |
| 2017/0074815 A1* | 3/2017 | Udrea | H05B 3/265 |
| 2018/0313800 A1* | 11/2018 | Rogers | G01N 25/48 |

OTHER PUBLICATIONS

Gràcia et al., "Results on the reliability of silicon micromachined structures for semiconductor gas sensors", Sensors and Actuators B 77: 409-415, 2001 (7 pages).

Hwang et al., "Development of Micro-Heaters with Optimized Temperature Compensation Design for Gas Sensors", *Sensors* (11): 2580-2591, 2011 (12 pages).

Lee et al., "Design and optimisation of a high-temperature silicon micro-hotplate for nanoporous palladium pellistors," Microelectronics Journal 34(2): 115-126, Feb. 2003 (12 pages).

Velmathi et al., "2D Simulations and Electro-Thermal Analysis of Micro-Heater Designs Using COMSOL™ for Gas Sensor Applications", COMSOL Conference 2010, India (25 pages).

Velmathi et al., "Design, Electro-Thermal Simulation and Geometrical Optimization of Double Spiral Shaped Microheater on a Suspended Membrane for Gas Sensing", IEEE 2010: 1258-1262 (5 pages).

Velmathi et al., "Importance of Temperature in Gas Sensors and Design, Fabrication, Testing of S shaped Low Power Platinum Microheater for Gas Sensor Applications", International Journal of Emerging Trends in Electrical and Electronics 5(2): 33-40, Jul. 2013 (8 pages).

\* cited by examiner

MICRO-HEATER ELEMENT FOR A MICROELECTROMECHANICAL SENSOR DEVICE AND CORRESPONDING MICROELECTROMECHANICAL SENSOR DEVICE

BACKGROUND

Technical Field

The present solution relates to a micro-heater element for a MEMS (Micro-Electro-Mechanical System) sensor and to a corresponding MEMS sensor.

Description of the Related Art

As is known, micro-heater elements, of the plate type (i.e., with an extension in a horizontal plane much larger than a corresponding thickness), also known as "microhotplates (MHP)", are used in MEMS sensors in a wide range of applications.

For instance, micro-heater elements are used in chemiresistive gas sensors, for heating a sensitive material arranged on top of the same elements (for example, a metal oxide or a polymer) and cause activation thereof for detection of gaseous species, in human expirate or in air, such as VOCs (Volatile Organic Substances) or toxic molecules (e.g., CO and methane). Formation of an array of micro-heater elements appropriately functionalized with different sensitive materials may enable development of the so-called "electronic nose".

As a further example, micro-heater elements are used as IR sources in NDIR (Non-Dispersive Infrared) detectors. The infrared radiation emitted excites gas molecules, for example $CO_2$ molecules, within an optical chamber; on the basis of the power absorbed by the gas molecules it is possible to derive the gas concentration.

In both applications described, the micro-heater element is required to reach very high temperatures, for example in the region of 500° C., which are obtained by heating via the Joule effect (i.e., via passage of a suitable electric current through the same micro-heater element). A low power consumption, low thermal stresses, a uniform temperature distribution, and a fast thermal response are characteristics required in the design of an efficient micro-heater element.

A non-uniform temperature is further unfavorable in so far as it causes the sensitive material coupled to the micro-heater element to operate at not well-defined temperatures and in conditions of higher thermomechanical stress. Instead, in the second exemplary application, a non-uniform temperature distribution leads to emission of infrared radiation on a wider band of wavelengths, with a consequent greater energy consumption.

The micro-heater element is typically provided on a thin dielectric membrane, suspended above a cavity formed in a body of semiconductor material, in particular silicon, so as to increase the thermal insulation of the same micro-heater element.

The geometrical dimensions and the shape of the micro-heater element are appropriately defined in order to obtain the desired uniformity of temperature, determining the power dissipated by the same micro-heater element. In particular, the power dissipated may be broken down into two factors: the power dissipated through air (linked to the surface area of the micro-heater element), which determines a contribution of useful power by heating of the associated sensitive element or by emission of IR radiation, and the power dissipated through the membrane towards the body of semiconductor material (linked to the perimeter of the micro-heater element), which determines a contribution of energy loss.

As the dimensions of the micro-heater element decrease, the contribution of dissipation from the perimeter increases as compared to the contribution of dissipation associated to the surface area. However, an increase of the dimensions of the micro-heater element generally leads to an increase of the resistance offered to the passage of electric current and a consequent undesirable increase in the electric-power consumption, clashing with the requirements of low consumption and low supply voltage generally valid in the context of the applications considered.

It is thus required that the total resistance of the micro-heater element should be contained, and this means that its geometrical shape should have a small number of "squares", i.e., assuming a simple rectangular structure, a low L/W ratio, where W is the width and L the length of the micro-heater element.

The containment of the size of the micro-heater element is generally further required in the perspective of miniaturization of a MEMS device that incorporates the same micro-heater element, both in terms of dimensions in the horizontal plane and in terms of thickness in a direction orthogonal to the horizontal plane.

This imposes a further limitation on the shape that the micro-heater element may assume, given that it is in general not possible to provide the surface to be heated with an "elongated" resistive structure (higher L/W ratio) so as to distribute with a higher number of degrees of freedom the heat where there is a greater loss. Nor would it be convenient to get round this obstacle by increasing the thickness of the micro-heater element, since this would exacerbate the problems of planarization and would present the further contraindication that the structure would be difficult to scale at smaller dimensions.

The reduction of the dimensions of the micro-heater element is further desirable to enable implementation of arrays of micro-heater elements for creating devices such as the aforementioned electronic nose. In this context, the use of thin metal layers favors a reduction of the spacings between the conductive paths also below one micron, thus being desirable.

A wide range of solutions have been proposed for providing an efficient structure of the micro-heater element, which may be able to satisfy one or more of the characteristics mentioned above.

Some proposed solutions suggest particular shapes and geometries for the formation of the micro-heater element, aimed at obtaining a substantially uniform temperature distribution in the sensitive area.

In this regard, the following documents may, for example, be cited:

"Design, Electro-Thermal Simulation and Geometrical Optimization of Double Spiral Shaped Microheater on a Suspended Membrane for Gas Sensing", Velmathi G., Ramshanker N., Mohan S., IECON 2010-36th Annual Conference on IEEE Industrial Electronics Society;

"2D Simulations and Electro-Thermal Analysis of Micro-Heater Designs Using COMSOL for Gas Sensor applications" Velmathi G., Ramshanker N., and Mohan S., COMSOL Conference 2010 India; and "Importance of Temperature in Gas Sensors and Design, Fabrication, Testing of S shaped Low Power Platinum Microheater for Gas Sensor Applications" Velmathi G., Mohan S., Ramshanker N., Institute of Research In Engineering and Technology (IRET), Vol. 5, No. 2, July 2013.

As highlighted by the authors in the above documents, the difficulty in obtaining a homogeneous temperature profile in the sensitive area is linked to the fact that the external part of the micro-heater element undergoes a greater loss of heat through the membrane towards the silicon (perimeter contribution). Consequently, the authors suggest a series of coiled geometries (referred to as "fan shape", "S-shape", "double-spiral", "honeycomb") that will make it possible to obtain, at least in a limited region overlying the micro-heater element, a portion of area in which the temperature is as uniform as possible.

However, geometries of this type, in which it is necessary to resort to long spirals or coils and in which the outer width of the electrical paths is reduced (to make up for the external cooling due to the perimeter contribution), give rise to micro-heater elements having high values of electrical resistance and thus requiring high driving voltages. Furthermore, part of the electric power is in any case dissipated outside the useful region, with consequent efficiency reduction.

Other known solutions envisage the use of so-called heat-spreading structures arranged on top of, or underneath, the micro-heater element and aimed at distributing in an optimized manner the generated heat.

In this regard, the following documents may for example be cited:

"Design, Simulation and Modeling of a Micromachined High Temperature Microhotplate for Application in Trace Gas Detection" Dennis J. O., Yousif A., Mohamad M. N., IEEE International Journal of Engineering & Technology, Vol. 10, No. 02; and "Results on the reliability of silicon micromachined structures for semiconductor gas sensors", Gracia I., Santander J., Cane C., Horrillo M. C., Sayago I., Gutierrez J., Sensors and Actuators B, 77 (2001), pp. 409-415.

The above documents describe, for example, manufacture of a heat-spreading structure of silicon carbide (SiC) on top of the micro-heater element, which enables improvement of the uniformity of the temperature profile exploiting the thermal conductivity of the silicon carbide, or else, manufacture of a silicon heat-spreader obtained via back etching of the body in which the membrane is made and confined under the area in which the micro-heater is present.

However, both solutions described entail an increase in thermal mass, due to the presence of an additional structure, which is added to the structure of the micro-heater to obtain the desired temperature uniformity. Furthermore, these solutions entail a considerable increase in the manufacturing complexity and the associated costs. For instance, the heat-spreading structures must be provided so as to guarantee a confinement thereof exclusively in the area of the micro-heater element, to prevent a conduction of heat towards the outer periphery of the silicon body, and thus a loss of efficiency.

A further solution is discussed in the document: "Development of Micro-Heaters with Optimized Temperature Compensation Design for Gas Sensors", Hwang W. J., Shin K. S., Roh J. H., Lee D. S., Choa S. H., Sensors 2011, 11, 2580-2591.

The above solution envisages the creation of a micro-heater element with a complex geometry, constituted by a series of polysilicon coils of variable size, arranged in parallel to one another and arranged so as to appropriately distribute the current and heat more at the outer part than at the inner part of the micro-heater element, thus guaranteeing a better uniformity of temperature.

The resulting temperature distribution is, however, sufficiently uniform only in a very limited area of the micro-heater element. Furthermore, also this solution leads to an increase in complexity of production and manufacturing costs.

Consequently, in general the known solutions are not altogether satisfactory. These solutions in fact seek to obtain a homogeneous temperature profile, at the expense of deterioration of other important characteristics of the micro-heater element, such as electrical resistance (and thus supply voltage and electric-power consumption of electricity), simplicity of production, or else thermal-response rate (in the case of dynamic operation).

BRIEF SUMMARY

Embodiments are directed to a micro-heater element for a MEMS sensor device and a corresponding MEMS sensor device.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

An aspect of the present solution stems from the realization, by the Applicant, that the geometry of the micro-heater element plays an important role for the energy to be shared appropriately between an outer peripheral region and an inner region of the micro-heater element so as to obtain a homogeneous temperature profile.

Figure 1:
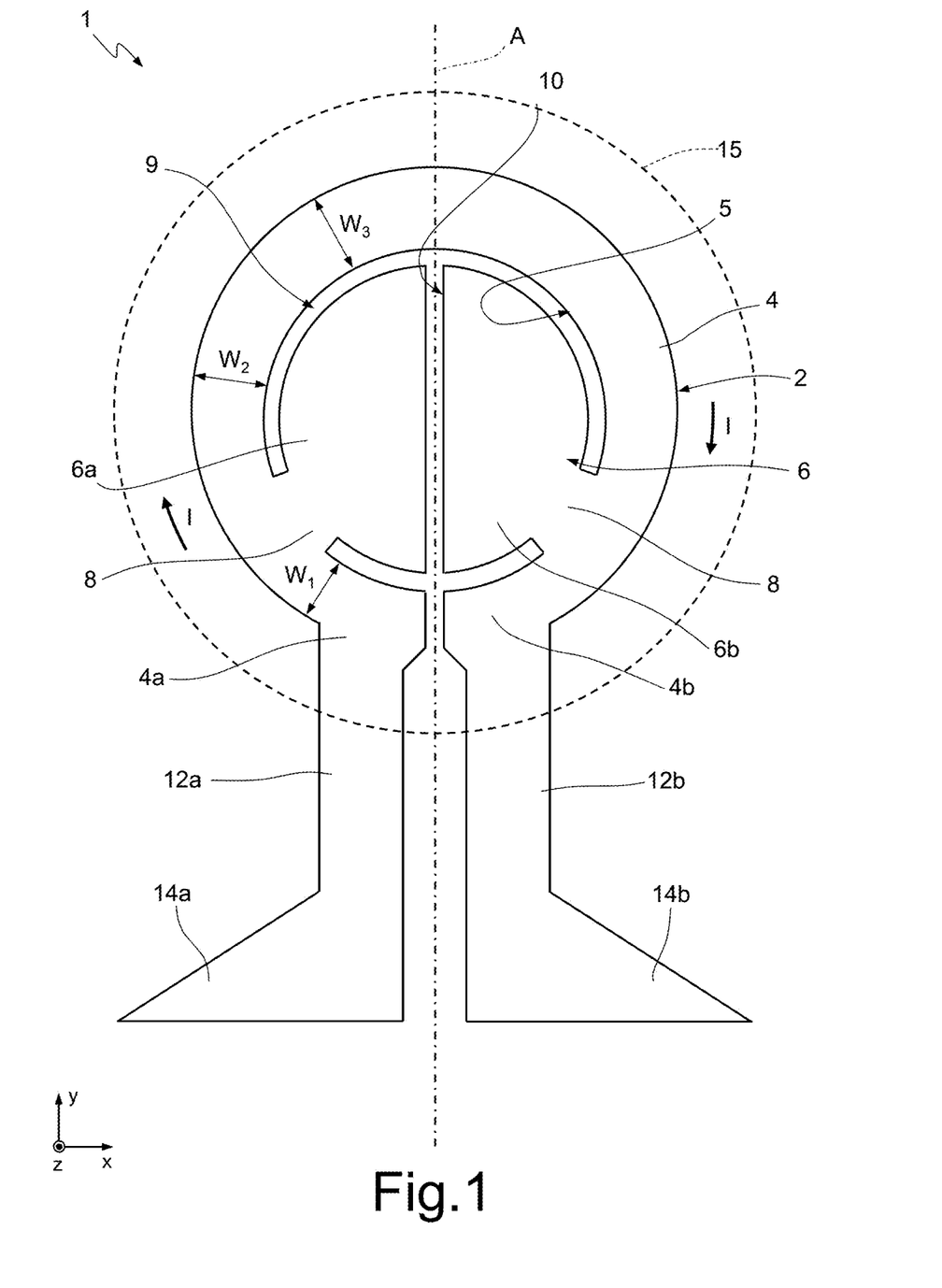
FIG. 1 is a schematic top plan view of a micro-heater element, according to a first embodiment of the present solution.

With reference to FIG. 1, a micro-heater element 1 is described according to a first embodiment of the present solution.

The micro-heater element 1 is provided by a single conductive layer 2, in particular a thermally conductive material, which may be metallic, for example platinum or tungsten, and has a substantially planar extension in a horizontal plane xy (defined by a first horizontal axis x and by a second horizontal axis y), with a thickness that is substantially negligible in a vertical direction z, orthogonal to the horizontal plane xy.

The micro-heater element 1 comprises, defined starting from a same conductive layer 2: an outer ring 4, having a generically circular shape and defining inside it an opening or a window 5; a heat-diffusion structure 6, arranged inside the outer ring 4, within the aforesaid window 5; and connection elements 8, arranged between the heat-diffusion structure 6 and the outer ring 4 and designed to connect the same heat-diffusion structure 6 and outer ring 4, which are elsewhere separated by a first separation gap 9.

In particular, the heat-diffusion structure 6 is constituted by two portions 6a, 6b, with a substantially semicircular shape, entirely separated from one another by a second separation gap 10, having an extension along a diametral axis A, in the example parallel to the second horizontal axis y, in a central position with respect to the window 5. The diametral axis A constitutes, in the example, an axis of symmetry for the micro-heater element 1, in the horizontal plane xy.

The connection elements 8 are in a number equal to two, each connecting a respective portion 6a, 6b of the heat-diffusion structure 6 to a facing portion of the outer ring 4, traversing the first separation gap 9; the connection elements 8 extend in a radial direction, symmetrically with respect to the aforesaid diametral axis A.

The outer ring 4 is open in a position corresponding to the diametral axis A and has a first end 4a and a second end 4b, separated from one another by the second separation gap 10, which thus extends throughout the outer ring 4. The connection elements 8 are, in the embodiment illustrated, arranged in the proximity of the aforesaid first and second ends 4a, 4b.

The first and second ends 4a, 4b are connected to a first electrical line 12a and to a second electrical line 12b, respectively, which are also defined starting from the conductive layer 2 and define an input line and an output line, respectively, for an electric current I. The outer ring 4 defines a continuous path for the electric current I, between the aforesaid first and second ends 4a, 4b.

The first and second electrical lines 12a, 12b extend in the example along the second horizontal axis y and are in turn connected to a first contact pad 14a and a second contact pad 14b, which define an input pad and an output pad, respectively, for the electric current I.

As will be discussed in detail hereinafter, the micro-heater element 1 is designed to be coupled on a membrane 15, represented schematically in FIG. 1 with a dashed line, suspended above a cavity provided in a body of semiconductor material (not illustrated in the same FIG. 1); in the example, the membrane 15 has a substantially circular shape in the horizontal plane xy, with a diameter larger than the diameter of the outer ring 4 of the micro-heater element 1.

In use, the outer ring 4 is traversed by the electric current I, which is supplied via the electrical lines 12a, 12b and the contact pads 14a, 14b, and which, by the Joule effect, causes a dissipation of energy through the outer ring 4. A part of the heat generated propagates towards the heat-diffusion structure 6 through the connection elements 8, and the same heat-diffusion structure 6 distributes the heat generated, inside the micro-heater element 1, in a uniform manner.

In particular, the portions 6a, 6b of the heat-diffusion structure 6 are electrically separated from one another so that there is no passage of electric current within the same heat-diffusion structure 6. Consequently, in the heat-diffusion structure 6 there is no dissipation of electric power by the Joule effect; in other words, the internal part of the micro-heater element 1 is heated just by diffusion of the power dissipated on the outer ring 4, which is appropriately transferred towards the center through the connection elements 8 and the heat-diffusion structure 6.

Figure 2:
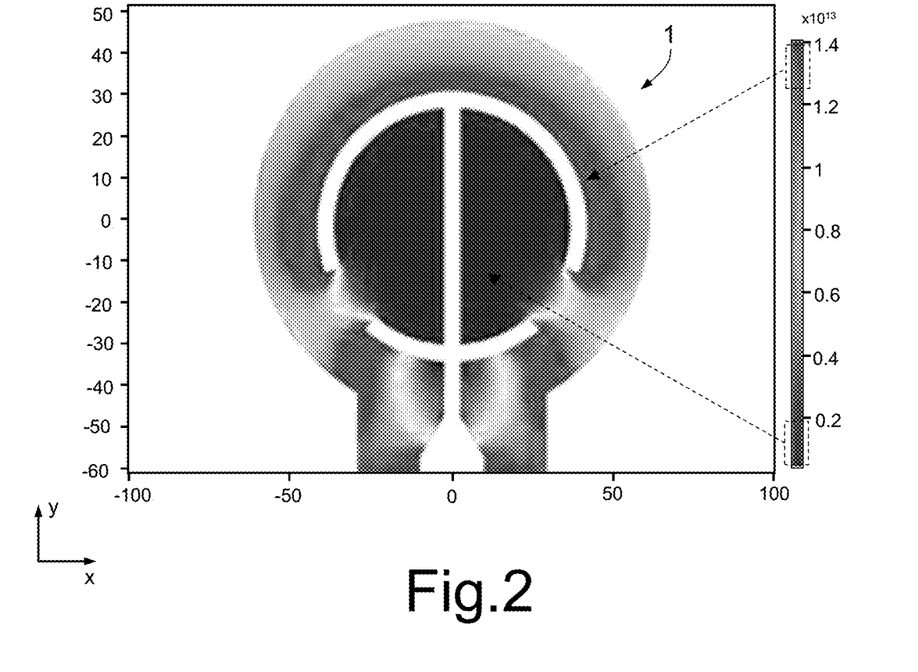
FIG. 2 shows a distribution of electric power relating to the micro-heater element of FIG. 1.

This behavior is illustrated by FIG. 2, which shows the distribution of electric power in the micro-heater element 1 and in particular the absence of power dissipation in the heat-diffusion structure 6.

Figure 3:
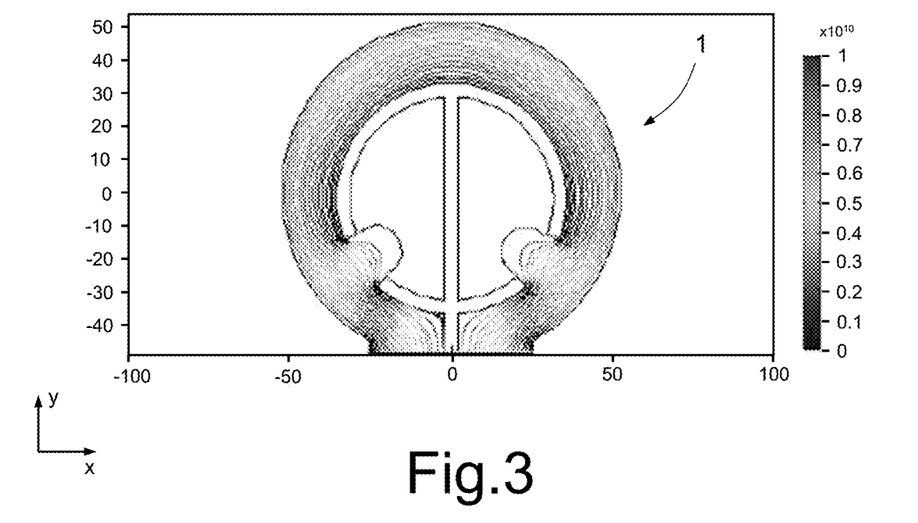
FIG. 3 shows electric-current lines in the micro-heater element of FIG. 1.

As illustrated in FIG. 3, the lines of the electric current I thus run along the outer ring 4, mainly concentrating in the inner region of the outer ring 4 (which defines a less resistive path). At the connection elements 8, the current lines tend to spread and thus the energy dissipated in the outer ring 4, in said areas, decreases.

In order to compensate this effect, the width of the outer ring 4, at the connection elements 8, is appropriately reduced, so that an amount of heat sufficient to balance the temperature of the entire micro-heater element 1 may propagate through the same connection elements 8.

The outer ring 4 is thus configured (symmetrically with respect to the diametral axis A) so as to have a variable width along its extension. In the embodiment illustrated in FIG. 1, the outer ring 4 has a first width W1 at the connection elements 8, and progressively widens at a distance from said connection elements 8, assuming a second width W2 (at a first distance from the connection elements 8) and then a third width W3 at the diametral axis A (at a second distance from the connection elements 8, greater than the first distance), where: W1<W2<W3.

At the narrowest portion of the outer ring 4 (having the first width W1) there is a greater dissipation by the Joule effect. The connection elements 8, arranged in a position corresponding to this narrowest portion, are configured so as to convey part of the energy produced in excess towards the respective portions 6a, 6b of the heat-diffusion structure 6, which operates so as to diffuse the heat uniformly in the region inside the ring.

Figure 4A:
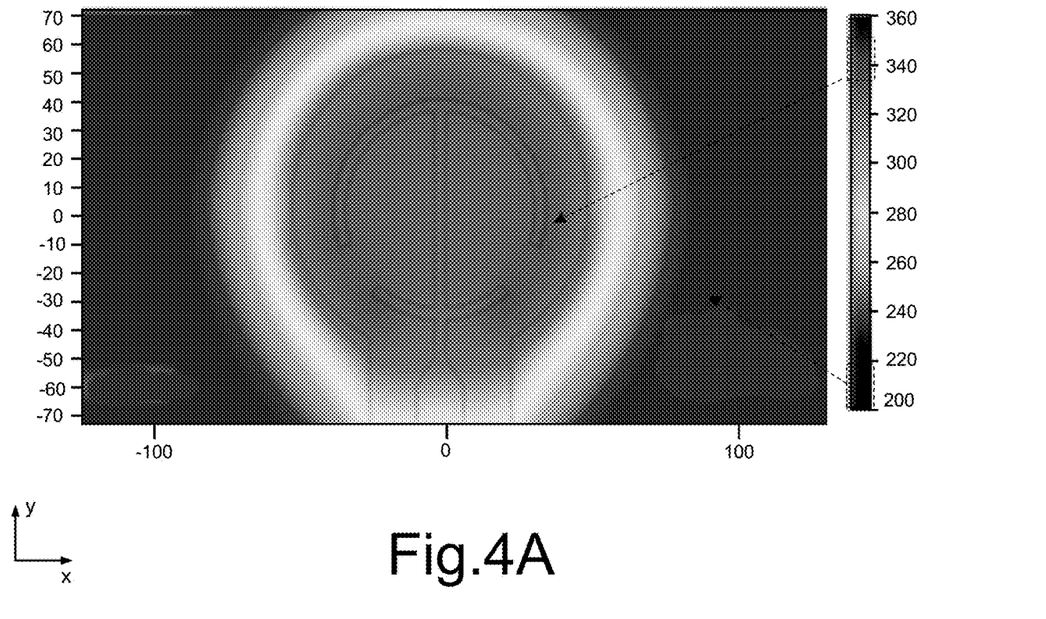
FIG. 4A-4B show the temperature distribution in the micro-heater element of FIG. 1.
Figure 4B:
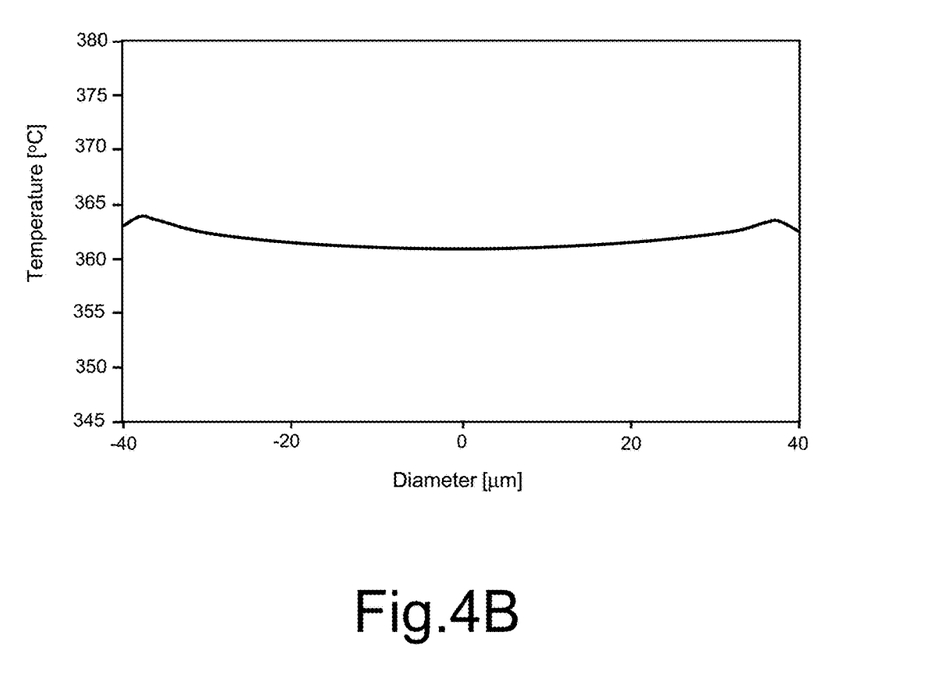

FIG. 4A shows the resulting temperature distribution through the micro-heater element 1 and in particular its uniformity within the same micro-heater element 1. FIG. 4B shows the plot of the temperature, which is substantially uniform, along a diameter of the structure (in the example, along the first horizontal axis x). The micro-heater element 1 has been simulated with a diameter of 100 µm using a metal layer of platinum with a thickness of 0.17 µm, suspended above a membrane obtained via three dielectric layers arranged on top of one another ($SiO_2/Si_3N_4/SiO_2$); it has further been assumed that the micro-heater element 1 is encapsulated in a $SiO_2$ dielectric layer with a thickness of 0.7 µm. The width of the outer ring 4 ranges from W1=14 µm (minimum value) to W3=18 µm (maximum value). The value of the separation gaps 9, 10 is assumed equal to 4 µm.

It should be noted that the structure described enables a maximum temperature variation ΔT to be obtained lower than 4° C. throughout the useful area defined by the micro-heater element 1, here having a value of approximately 90 µm.

The connection elements 8, which connect the portions 6a, 6b of the heat-diffusion structure 6 to the outer ring 4, may be arranged also in different points of the structure of the micro-heater element 1.

Figure 5:
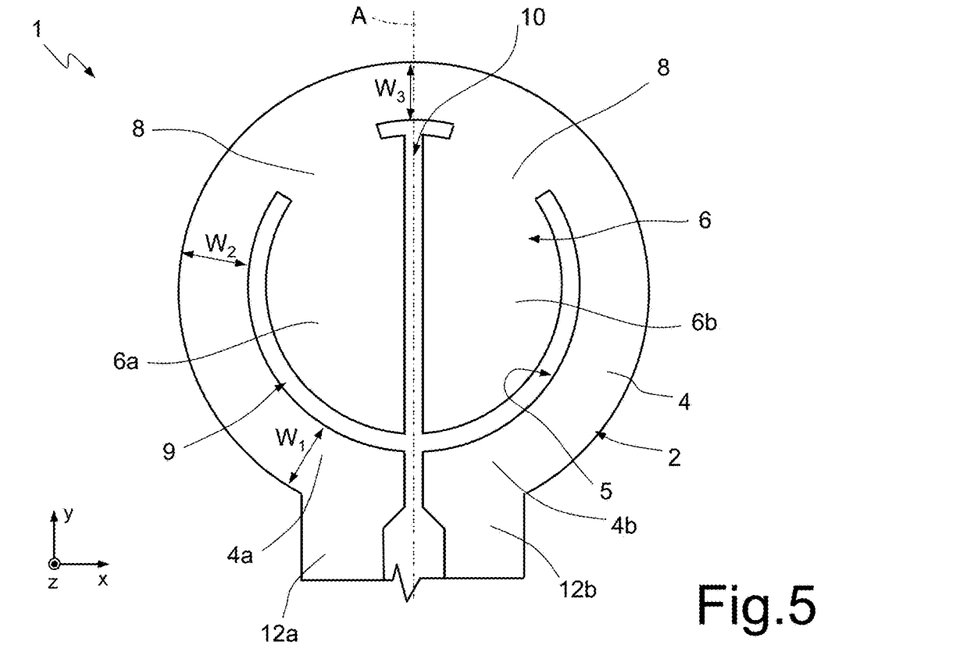
FIGS. 5 and 6 show respective schematic top plan views of variants of the micro-heater element, according to the first embodiment of the present solution.

As illustrated in FIG. 5, for example, the connection elements 8 may be arranged in a position diametrally opposite with respect to the ends 4a, 4b of the outer ring 4, once again with an arrangement symmetrical with respect to the diametral axis A. In this case, the relation between the first, second, and third widths W1, W2, W3 of the outer ring 4 itself is consequently the following: W1>W2>W3.

Also this embodiment enables an optimal uniformity in the distribution of the surface temperature of the micro-heater element 1 to be obtained.

The number of the connection elements 8 may further be greater than two.

Figure 6:
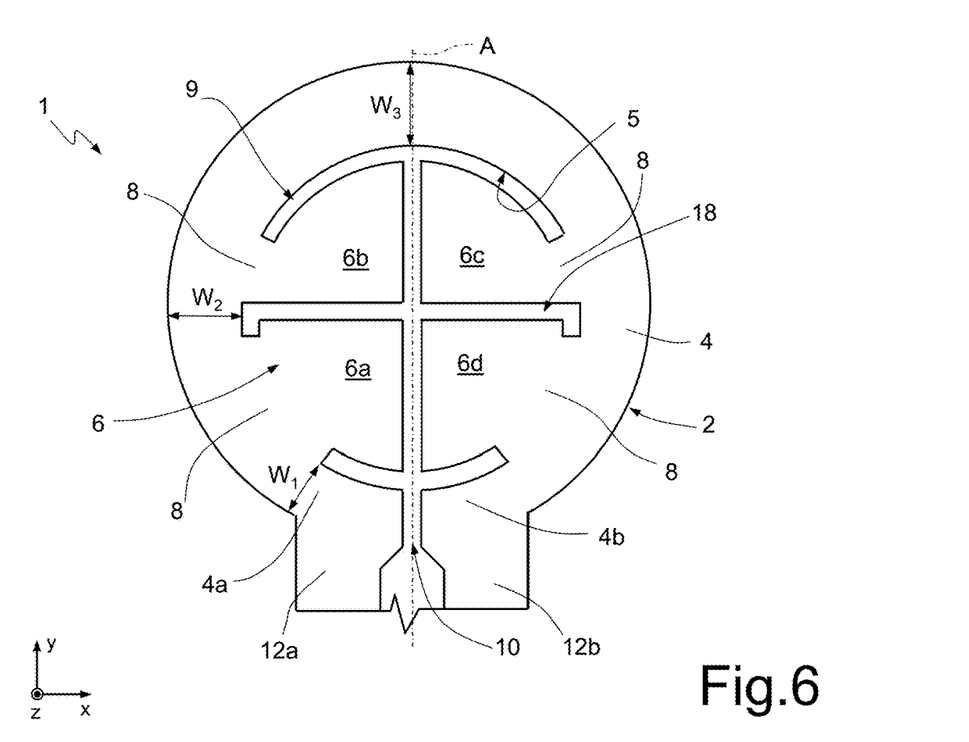

For instance, as illustrated in FIG. 6, there may be provided four connection elements 8, and the heat-diffusion structure 6 may in this case be divided into four portions 6a-6d, physically and electrically separated from one another by the second separation gap 10 and, in this case, by a third separation gap 18, having an extension parallel to the first horizontal axis x, in a central position with respect to the window 5 and intersecting the second separation gap 10 at the center of the window 5.

In particular, a first pair of connection elements 8, symmetrical to one another with respect to the diametral axis A, is once again arranged at the ends 4a, 4b of the outer ring 4, whereas a second pair of connection elements 8, which are also symmetrical with respect to the diametral axis A, is in this case arranged on the opposite side of the third separation gap 18, with respect to the first pair of connection elements 8.

The width of the outer ring 4 is designed to satisfy the following relation: W1<W2<W3 between the first, second, and third widths W1, W2, W3. Moreover, the connection elements 8 of the first pair, arranged in positions corresponding to the portions of the outer ring 4 with smaller width (equal to the first width W1) have a greater extension (along the circumference of the outer ring), and a corresponding greater area of connection, than the connection elements 8 of the second pair, arranged in positions corresponding to the portions of the outer ring 4 with greater width, so as to obtain a greater uniformity in the heating of the micro-heater element 1.

Also this embodiment thus enables an optimal uniformity in the distribution of the surface temperature of the micro-heater element 1.

Furthermore, this variant may be advantageous to enable the production of micro-heater elements 1 with a greater extension of sensitive area, for example with the outer ring 4 having a diameter even of 500 μm; this characteristic may be useful, for example, in IR-emission MEMS devices.

Tests conducted by the present Applicant have shown the possibility of obtaining a useful area of approximately 460 μm, in which there is a maximum temperature variation ΔT of around 13° C.

In general, advantageously, the solution described is easily scalable (i.e., re-sizable), both upwards and downwards, by an appropriate dimensional choice for the outer ring 4, the connection elements 8, and the heat-diffusion structure 6, without there being envisaged modifications either from the structural standpoint or from the operation standpoint.

Figure 7:
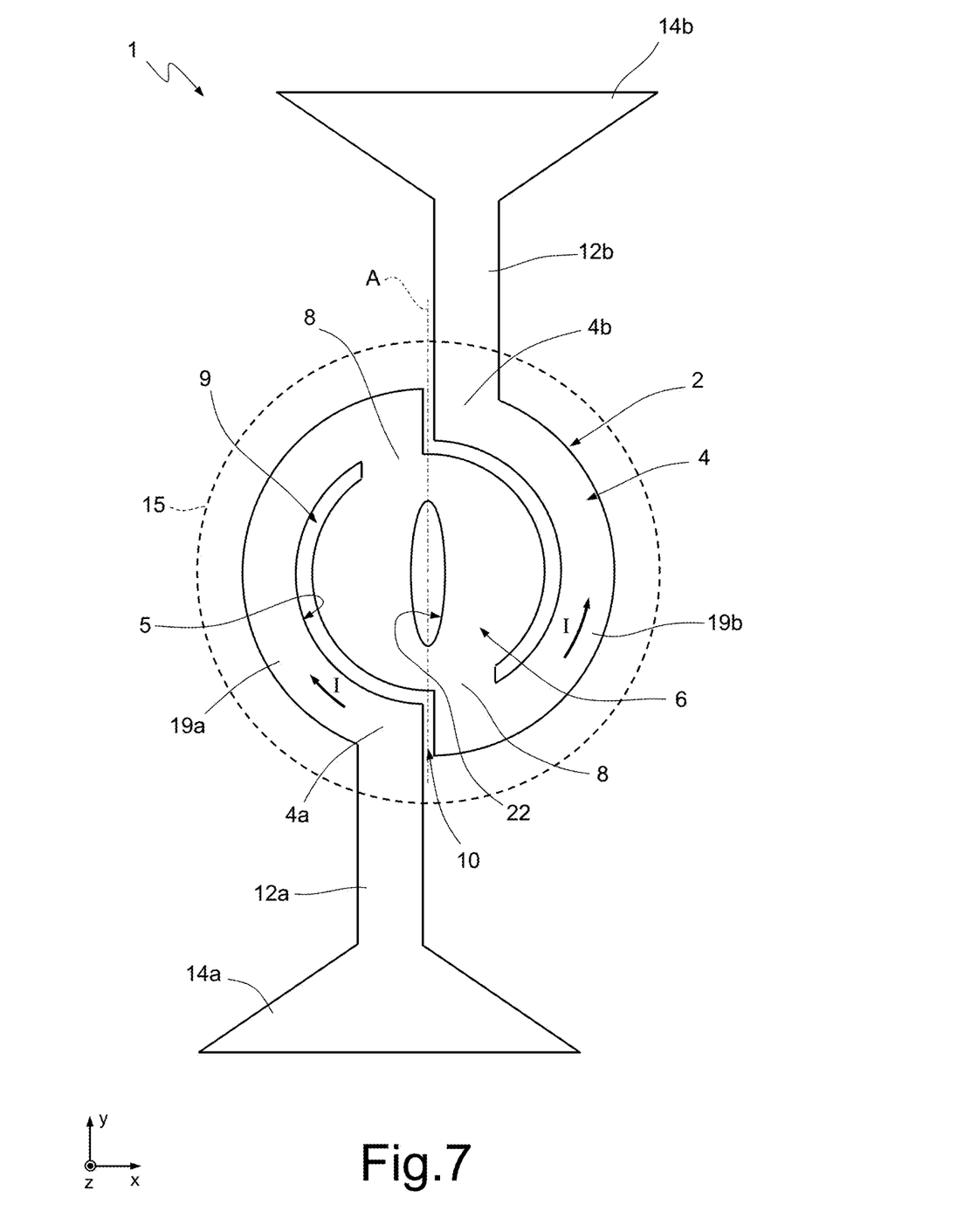
FIG. 7 shows a schematic top plan view of a micro-heater element, according to a second embodiment of the present solution.

With reference to FIG. 7, a second embodiment of the present solution is now discussed, which differs, with respect to the first embodiment, from the standpoint of the structure of the micro-heater element 1, but not from the standpoint of operation and of the corresponding operating principles.

The micro-heater element, designated also in this case by 1, comprises once again the outer ring 4, the heat-diffusion structure 6, and the connection elements 8, substantially as in the first embodiment discussed previously, once again provided starting from the same conductive layer 2.

In this case, the outer ring 4 is, however, divided into two half-rings 19a, 19b physically distinct and separated from one another at the diametral axis A (which in this case does not constitute an axis of symmetry for the structure, which is instead symmetrical with respect to the geometrical center of the outer ring 4).

A first half-ring 19a defines the first end 4a of the outer ring 4, connected to the first electrical line 12a and to the first contact pad 14a; likewise, the second half-ring 19b defines the second end 4b of the outer ring 4, connected to the second electrical line 12b and to the second contact pad 14b.

The first and second electrical lines 12a, 12b (for input and output of the electric current I) are in this case diametrally opposite, and arranged on opposite sides of the outer ring 4 along the diametral axis A; this implies that, in this embodiment, the half-rings 19a, 19b of the outer ring 4 are traversed by electric current in the same direction (with respect to the direction of the diametral axis A or of the second horizontal axis y).

The half-rings 19a, 19b are here connected to one another mechanically and electrically through the connection elements 8 and the heat-diffusion structure 6.

The above heat-diffusion structure 6 is in this case constituted by a single portion of the conductive layer 2, which has a substantially circular shape in the horizontal plane xy and defines centrally an elliptical opening 22, elongated along the diametral axis A; the aforesaid geometrical center is arranged centrally with respect to this opening 22.

The connection elements 8 are arranged on diametrally opposite sides along the diametral axis A and connect the first half-ring 19a and the second half-ring 19b, respectively, to the heat-diffusion structure 6, at the respective end opposite to the first end 4a and, respectively, to the second end 4b of the outer ring 4.

Thus, in this case the heat-diffusion structure 6 is traversed by the electric current I; however, the dissipation of electrical energy by the Joule effect is substantially negligible, being for example approximately 1/10 of the dissipation on the outer ring 4. The electrical resistance offered to the passage of the electric current I is in fact very low (as is evident from an examination of FIG. 7, the useful section for passage of the electric current I is in fact much wider than the width of the outer ring 4).

Figure 8A:
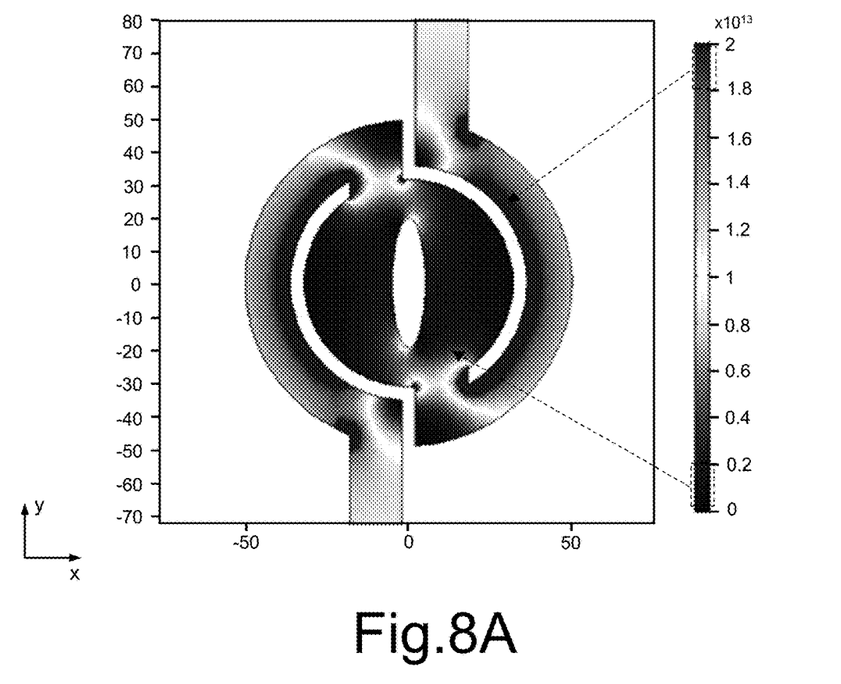
FIG. 8A-8B show the power distribution and the temperature distribution, respectively, in the micro-heater element of FIG. 7.

This behavior is illustrated by FIG. 8A, which shows the distribution of electric power in the micro-heater element 1, and in particular the substantial absence of power dissipation in the heat-diffusion structure 6.

Consequently, in this case the micro-heater element 1 may be considered as being constituted by two thermally conductive half-rings 19a, 19b, which, when they are traversed by the electric current I, dissipate energy by the Joule effect and transfer a part of the same energy towards the inner region via the connection elements 8; the heat transferred is thus uniformly distributed by the heat-diffusion structure 6, where the dissipation of energy by the Joule effect is negligible.

Figure 8B:
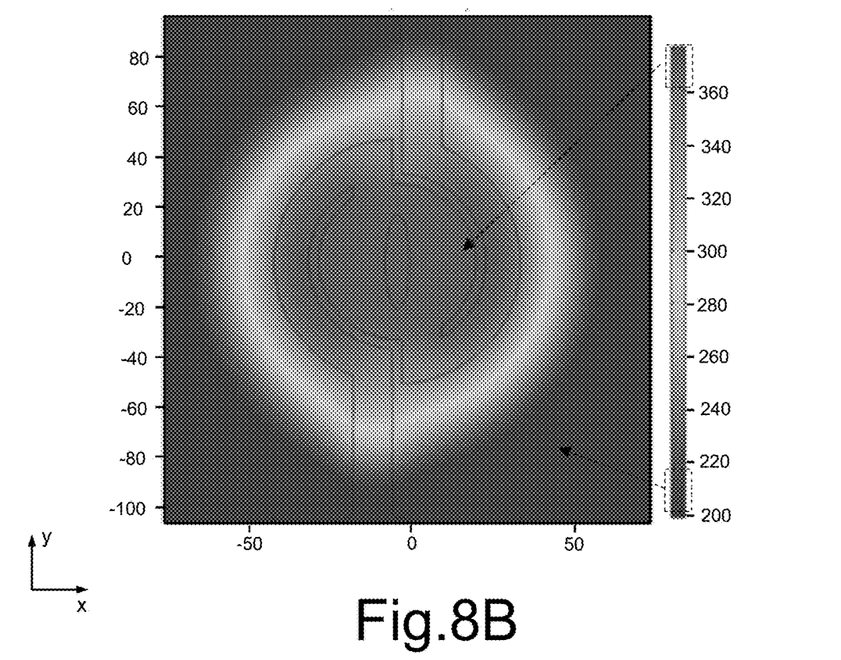

FIG. 8B shows the resulting, substantially uniform, distribution of the surface temperature of the micro-heater element 1.

Figure 9:
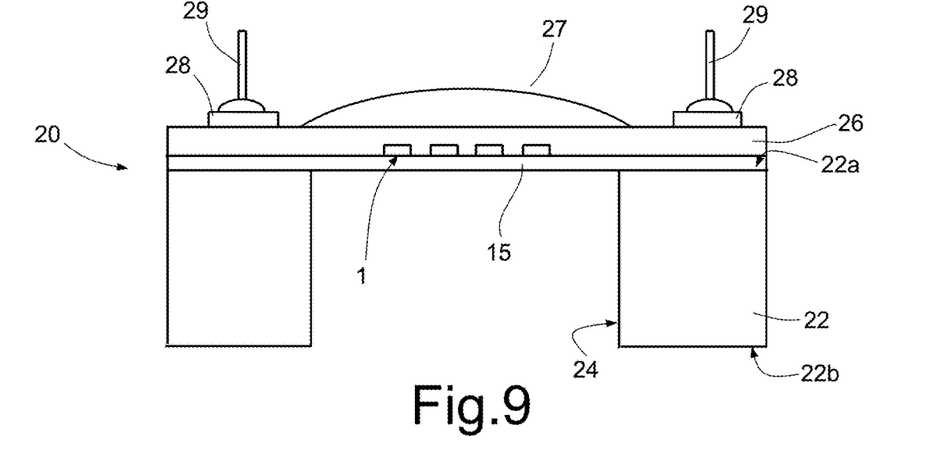
FIG. 9 is a schematic representation of a MEMS sensor device that incorporates the micro-heater element, according to a further aspect of the present solution.

With reference to FIG. 9, a description of a MEMS sensor device 20, which integrates the micro-heater element 1 described previously, is now made. The MEMS sensor device 20 is, for example, a chemiresistive sensor or an NDIR sensor.

The MEMS sensor device 20 comprises a structural layer 22, of semiconductor material, in particular silicon, having a top surface 22a and a bottom surface 22b. A cavity 24 is formed in the structural layer 22 and defines, at the top surface 22a of the structural layer 22, the membrane 15 of dielectric material, which is arranged above the same cavity 24.

The micro-heater element 1 is arranged vertically on top of the membrane 15, in a position corresponding to the cavity 24; the micro-heater element 1 is further arranged within a passivation region 26.

A coating region 27 is formed on the passivation region 26, in a position vertically corresponding to the micro-heater element 1. For instance, the coating region 27 is constituted by an appropriate thermally activated gas-sensitive material, in the case of a chemiresistive sensor, designed to be heated, in use, by the micro-heater element 1; alternatively, the coating region 27 may constitute a region of absorption, or emission of IR radiation (the so-called black layer), in the case of an NDIR sensor equipped with an efficient IR source.

FIG. 9 further schematically illustrates electrodes 28 of the MEMS sensor 20, arranged in contact (in a way not illustrated in detail) with the contact pads 14a, 14b and contacted in use by an external electrical system, by electrical wires 29.

A description of a possible process for manufacture of the MEMS sensor 20 is now presented.

Figure 10A:
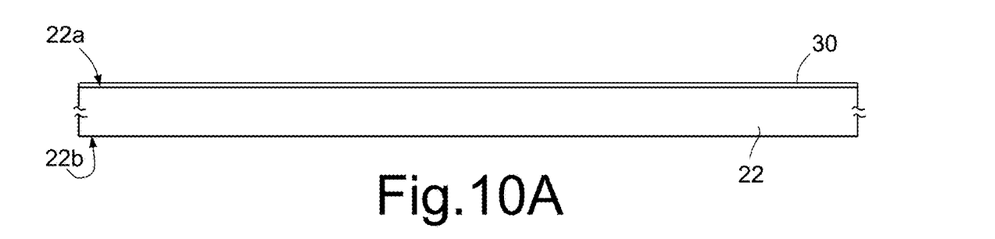
FIGS. 10A-10H are schematic cross-sectional views in successive steps of a process for manufacturing the MEMS sensor device of FIG. 9.

In an initial step of the process (FIG. 10A), the structural layer 22, made, for example, of silicon, undergoes a thermal oxidation process, for the formation of an oxide layer 30, for example silicon oxide.

Figure 10B:
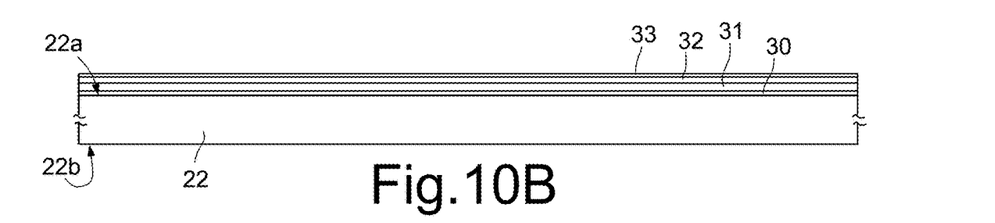

With reference to FIG. 10B, a nitride layer 31, a TEOS oxide layer 32, and a barrier layer 33, made, for example, of Ti/TiN are deposited in succession on top of the oxide layer 30.

Figure 10C:
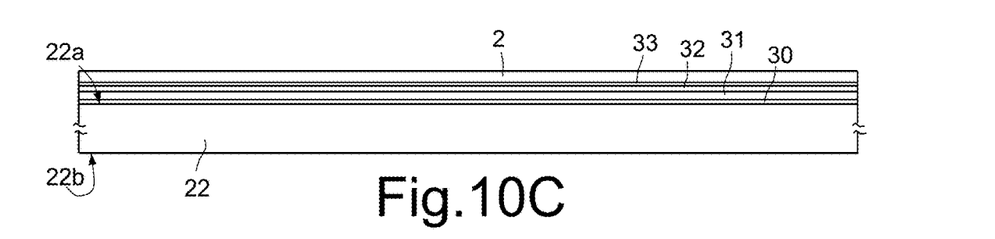

With reference to FIG. 10C, the metal layer 2, for example of tungsten, is formed, for example by CVD (Chemical Vapor Deposition), on the barrier layer 33.

Figure 10D:
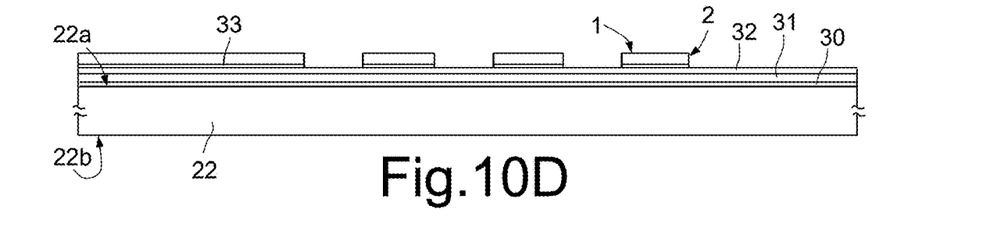

As illustrated in FIG. 10D, the metal layer 2, and the underlying barrier layer 33, are then subjected to chemical etching, through an appropriate masking, for definition of the micro-heater element 1, and in particular of the corresponding geometrical structure (described in detail previously); the corresponding electrical lines 12a, 12b and contact pads 14a, 14b (here not represented in detail) are further formed, via definition of the same metal layer 2.

Figure 10E:
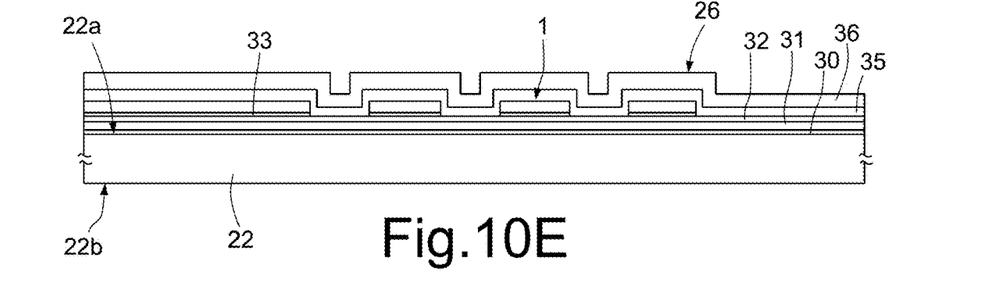

With reference to FIG. 10E, a TEOS oxide layer 35 and a nitride layer 36 are deposited in succession on the micro-heater element 1, jointly defining the passivation region 26 in which the micro-heater element 1 is englobed.

Figure 10F:
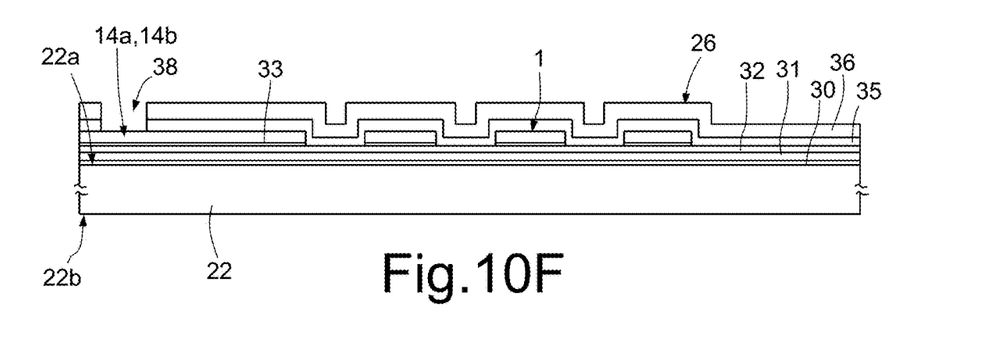

With reference to FIG. 10F, an etching is carried out through the nitride layer 36 and the TEOS oxide layer 35, in order to reach the micro-heater element 1, and in particular the corresponding contact pads 14a, 14b, thus forming contact openings 38 to enable electrical contact from the outside towards the same contact pads 14a, 14b, for example by the aforesaid electrical wires 29 (here not illustrated).

Figure 10G:
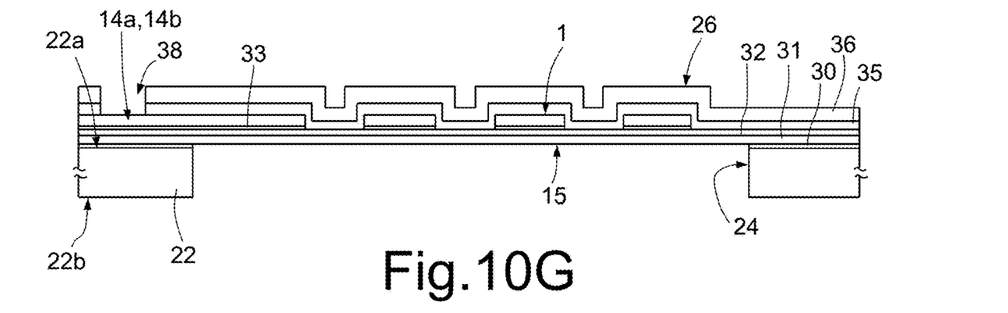

The manufacturing process continues (FIG. 10G), with the formation of the cavity 24 and, simultaneously, of the membrane 15, by back etching of the structural layer 22, starting from the rear surface 22b as far as the oxide layer 30. The membrane 15, which is suspended above the cavity 24, is thus formed, in this case by portions arranged on top of one another of the oxide layer 30, of the nitride layer 31, and of the TEOS oxide layer 32.

Figure 10H:
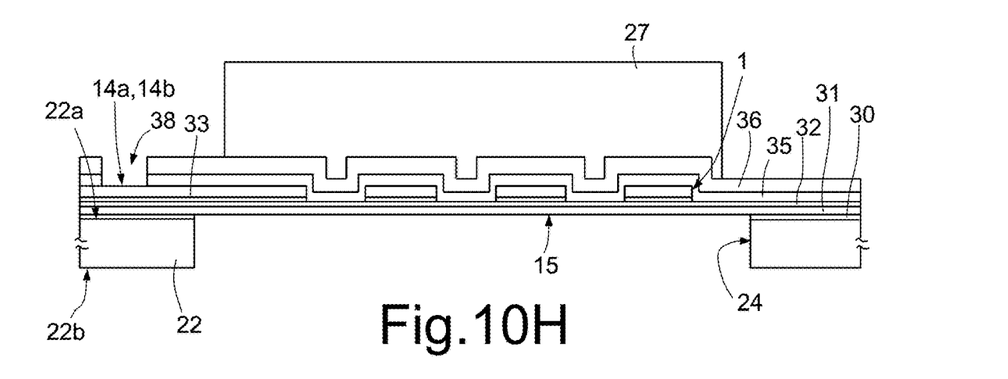

With reference to FIG. 10H, the coating region 27 is deposited vertically on top of the micro-heater element 1, being, for example, constituted by a region of absorption/emission of IR radiation.

The advantages of the present solution emerge clearly from the foregoing description.

In any case, it is once again highlighted that the solution described provides a micro-heater element 1 having a high uniformity of surface temperature within an entire sensitive area, the dimensions of which may be easily scaled according to the application requirements (for example, in a range between 50 µm and 500 µm).

The micro-heater element 1 enables, at the same time, reduced values of electrical resistance, voltage, supply power, and thermal inertia to be achieved thanks to the fact that it is obtained by a thin metal layer, without requiring additional thermally conductive layers.

The structure described enables, using a single conductive layer, dissipation of the power mainly in the peripheral region of the micro-heater element 1 and appropriate transfer of the heat towards the center, thus achieving a uniform heat distribution.

Furthermore, the manufacturing process is simple and economically advantageous to implement.

The aforesaid advantages thus render particularly advantageous the use of the micro-heater element 1 in a MEMS sensor device 20, for example a chemiresistive sensor or an NDIR sensor.

Finally, it is clear that modifications and variations may be made to what has been described and illustrated herein, without thereby departing from the scope of the present disclosure.

For instance, it is highlighted that the number of portions into which the heat-diffusion structure 6 may be divided (and, consequently, the number of the connection elements 8) may be different from what has been illustrated, for example even higher than four, in the case of structures with large dimensions in the horizontal plane xy.

Furthermore, it is highlighted that the micro-heater element 1 may advantageously be used also in other types of sensors or, in general, of MEMS devices, where uniform generation of heat with a reduced consumption of electrical energy is required.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A micro-heater element for a MEMS sensor device, comprising:
   a single conductive layer, the single conductive layer including:
      an outer ring;
      a heat-diffusion structure;
      an opening that extends through the heat-diffusion structure and between the heat-diffusion structure and the outer ring; and
      a plurality of connection elements coupling the heat-diffusion structure to the outer ring,
      wherein the outer ring is configured to dissipate energy upon passage of an electric current, and the heat-diffusion structure is configured to distribute, inside the micro-heater element, heat that is transferred by the outer ring through the connection elements.

2. The micro-heater element according to claim 1, wherein the heat-diffusion structure is configured to have a substantially negligible dissipation of electrical energy and is configured to transfer heat from the connection elements towards the center of the micro-heater element by thermal conduction.

3. The micro-heater element according to claim 1, wherein the outer ring defines a path for the electric current to flow through from a first end of the outer ring that is configured to be coupled to an electrical input line to a second end of the outer ring that is configured to be coupled to an electrical output line.

4. The micro-heater element according to claim 3, wherein the opening physically and electrically separates a first portion of the heat-diffusion structure from a second portion of the heat-diffusion structure, wherein the opening extends along a diametral axis that is an axis of symmetry for the micro-heater element in a horizontal plane.

5. The micro-heater element according to claim 4, wherein a perimeter of the outer ring has a variable width, wherein the width is smallest at the plurality of connection elements and greatest at a distance that is farthest from the plurality of connection elements.

6. The micro-heater element according to claim 4, wherein the plurality of connection elements extend radially from the heat-diffusion structure and have first and second ends; and wherein the outer ring has a first width at the plurality of connection elements and a second width at a first distance from the plurality of connection elements, the second width being greater than the first width.

7. The micro-heater element according to claim 6, wherein the outer ring has a third width at a second distance from the plurality of connection elements, the second distance being greater than the first distance, where the following relation applies:

$$W1<W2<W3$$

where W1 is the first width, W2 is the second width, and W3 is the third width.

8. The micro-heater element according to claim 4, wherein the outer ring has a substantially circular conformation in the horizontal plane, and wherein the first and second portions of the heat-diffusion structure have a substantially semicircular shape in the horizontal plane with a planar edge at the opening that extends through the heat-diffusion structure, wherein the opening includes an axis of symmetry for the micro-heater element.

9. The micro-heater element according to claim 4, wherein the heat-diffusion structure further comprises a third portion and a fourth portion, the first, second, third and fourth portions being physically and electrically separated from one another by the opening, and wherein the plurality of connection elements include a first pair of connection elements and a second pair of connection elements, the first pair of connection elements being arranged at a first end of the outer ring and the second pair of connection elements being arranged at a second, opposite end of the outer ring.

10. The micro-heater element according to claim 9, wherein the first pair of connection elements are arranged in positions at which the outer ring has a first width and the second pair of connection elements are arranged in positions at which the outer ring has a second width, the second width being greater than the first width, wherein the first pair of connections are larger than the second pair of connections.

11. The micro-heater element according to claim 4, wherein the outer ring extends continuously from the first end to the second end.

12. The micro-heater element according to claim 1, wherein the outer ring is a thermally conductive material.

13. A micro-heater element, comprising:
a single conductive layer including:
an outer ring having a first portion and a second portion;
a heat-diffusion structure having a central opening;
first and second openings, the first opening separating the first portion of the outer ring from the heat-diffusion structure, the second opening separating the second portion of the outer ring from the heat-diffusion structure; and
first and second connection elements, the first connection element coupling the first portion of outer ring to the heat-diffusion structure, the second connection element coupling the second portion of the outer ring to the heat-diffusion structure.

14. The micro-heater element according to claim 13, wherein first and second portions of the outer ring include first and second half-rings, the first portion including a first end configured to be coupled to an electrical input line, the second portion including a second end configured to be coupled to an electrical output line.

15. The micro-heater element according to claim 13, wherein in use, electric current travels through the heat-diffusion structure from the first end to the second end, wherein the heat-diffusion structure has a resistance to the electric current to cause a negligible dissipation of energy as compared to the dissipation of energy in the outer ring.

16. The micro-heater element according to claim 15, wherein the first and second connection elements are arranged on diametrally opposite sides of the heat-diffusion structure.

17. The micro-heater element according to claim 13, wherein first and second half-rings have a shape of semi-circular rings in a horizontal plane, wherein the heat-diffusion structure has a substantially circular shape in the horizontal plane, and wherein electrical input and output lines are arranged on opposite sides of the outer ring along a diametral axis.

18. A MEMS sensor device, comprising:
a micro-heater element having a single conductive layer including:
an outer ring;
a heat-diffusion structure;
an opening that extends through the heat-diffusion structure and between the heat-diffusion structure and the outer ring; and
a plurality of connection elements coupling the heat-diffusion structure to the outer ring,
wherein the outer ring is configured to dissipate energy upon passage of an electric current, and the heat-diffusion structure is configured to distribute heat received from the outer ring by the connection elements; and
a coating region on the micro-heater element, the micro-heater element being configured to heat the coating region.

19. The sensor device according to claim 18, wherein the coating region is a gas-sensitive material that is thermally activated, and the sensor device is a chemiresistive sensor.

20. The sensor device according to claim 18, wherein the coating region is constituted by a region of absorption or emission of IR radiation, and the sensor device is an NDIR sensor.

21. The sensor device according to claim 18, further comprising:

a structural layer of semiconductor material and having a top surface and a bottom surface;
a cavity formed in the structural layer; and
a membrane of dielectric material arranged above the cavity at the top surface of the structural layer,
wherein said micro-heater element is arranged on the membrane and arranged vertically with respect to the cavity.

22. A process for manufacturing a MEMS sensor device, the process comprising:
forming, on a top surface of a structural layer, a conductive layer;
defining the conductive layer to form a micro-heater element including:
an outer ring;
a heat-diffusion structure;
an opening that extends through the heat-diffusion structure and between the heat-diffusion structure and the outer ring; and
a plurality of connection elements coupling the heat-diffusion structure to the outer ring,
wherein the outer ring is configured to dissipate energy upon passage of an electric current, and the heat-diffusion structure is configured to distribute, inside the micro-heater element, heat that is transferred by the outer ring through the connection elements; and
forming a coating region on the micro-heater element and configured to be heated by the micro-heater element.

23. The process according to claim 22, further comprising forming a cavity in the structural layer, and a membrane at the top surface of the structural layer and suspended above the cavity.

24. The process according to claim 23, wherein forming the cavity comprises etching the structural layer at a bottom surface, the bottom surface being opposite the top surface, wherein the micro-heater element is arranged on the membrane and arranged vertically with respect to the cavity.

* * * * *